United States Patent
Koller et al.

(10) Patent No.: US 11,557,670 B2
(45) Date of Patent: Jan. 17, 2023

(54) TYPE III-V SEMICONDUCTOR DEVICE WITH IMPROVED LEAKAGE

(71) Applicant: Infineon Technologies Austria AG, Villach (AT)

(72) Inventors: Christian Koller, Stoecklweingarten (AT); Ingo Daumiller, Oberaichwald (AT); Lauri Knuuttila, Villach (AT); Clemens Ostermaier, Villach (AT)

(73) Assignee: Infineon Technologies Austria AG, Villach (AT)

( * ) Notice: Subject to any disclaimer, the term of this patent is extended or adjusted under 35 U.S.C. 154(b) by 1 day.

(21) Appl. No.: 17/189,818

(22) Filed: Mar. 2, 2021

(65) Prior Publication Data
US 2022/0285539 A1 Sep. 8, 2022

(51) Int. Cl.
 H01L 29/778 (2006.01)
 H01L 29/15 (2006.01)
 H01L 29/36 (2006.01)

(52) U.S. Cl.
 CPC ........ H01L 29/7787 (2013.01); H01L 29/157 (2013.01); H01L 29/36 (2013.01)

(58) Field of Classification Search
 CPC ... H01L 29/7787; H01L 29/157; H01L 29/36; H01L 29/66431; H01L 29/66462; H01L 29/778–7789; H01L 29/122–127; H01L 29/15–158; H01L 2924/13064; H01L 21/22–228; H01L 21/38–388
See application file for complete search history.

(56) References Cited

U.S. PATENT DOCUMENTS

| | | | | |
|---|---|---|---|---|
| 2006/0197109 A1* | 9/2006 | Saxler | ................ | H01L 29/7787 257/E29.05 |
| 2020/0075314 A1* | 3/2020 | Chen | ................... | H01L 29/7786 |
| 2020/0300842 A1* | 9/2020 | Ram | ................... | G01N 27/4145 |
| 2021/0257467 A1* | 8/2021 | Chou | .................. | H01L 29/1066 |

OTHER PUBLICATIONS

Koller, Christian, et al., "Effect of Carbon Doping on Charging/Discharging Dynamics and Leakage Behavior of Carbon-Doped GaN", IEEE Transactions on Electron Devices, vol. 65, No. 12, Dec. 2018, 5314-5321.

* cited by examiner

*Primary Examiner* — Shahed Ahmed
(74) *Attorney, Agent, or Firm* — Murphy, Bilak & Homilier, PLLC (57) ABSTRACT

A semiconductor device includes a semiconductor substrate including a barrier region, a channel layer disposed below the barrier region and forming a heterojunction with the barrier region such that a two-dimensional charge carrier gas channel is disposed in the channel layer near the heterojunction, and a sub-channel region disposed below the channel layer, and a first interface in the semiconductor substrate between a first region of type III-V material and a second region of type III-V material that is disposed below the first region of type III-V material, wherein the first and second regions of type III-V material form polarization charges on either side of the first interface, wherein the first interface is within or formed by the sub-channel region, and wherein semiconductor substrate has a vertically varying dopant concentration of deep energy acceptor dopant atoms that is locally increased at the first interface.

15 Claims, 8 Drawing Sheets

TYPE III-V SEMICONDUCTOR DEVICE WITH IMPROVED LEAKAGE

TECHNICAL FIELD

The instant application relates to semiconductor devices, and particularly relates to high-electron-mobility transistor devices that are formed in type III-V semiconductor technology.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and an HEMT (high-electron-mobility Field Effect Transistor) also known as heterostructure FET (HFET) and modulation-doped FET (MODFET) are used in a variety of applications. An HEMT is formed from type III-V semiconductor material, e.g., gallium nitride (GaN), gallium arsenide (GaAs), etc. An HEMT includes a two-dimensional charge carrier gas that is created by a heterojunction between two layers of type III-V semiconductor material having different band gaps. This two-dimensional charge carrier gas provides the active device channel that accommodates the load current of the device. Due to the high mobility of carriers within the two-dimensional charge carrier gas, these devices offer very low on-resistance in comparison to other device technologies. For this reason, HEMTs are well suited for power switching applications, i.e., applications requiring the control of voltages in excess of 250V, 500V, 1000V, etc. or greater, and/or the control of current in excess of 1 A, 5 A, 10 A, etc.

Unwanted leakage currents may arise in HEMT devices during an off-state of the device. These leakage currents include lateral and vertical off-state currents caused by flow of minority carriers in a sub-channel region of the device that is below the two-dimensional charge carrier gas channel. It is desirable to reduce these off-state leakage currents to decrease unwanted power losses.

SUMMARY

A semiconductor device is disclosed. According to an embodiment, the semiconductor device comprises a semiconductor substrate comprising a barrier region, a channel layer disposed below the barrier region and forming a heterojunction with the barrier region such that a two-dimensional charge carrier gas channel is disposed in the channel layer near the heterojunction, and a sub-channel region disposed below the channel layer, and a first interface in the semiconductor substrate between a first region of type III-V material and a second region of type III-V material that is disposed below the first region of type III-V material, wherein the first and second regions of type III-V material form polarization charges on either side of the first interface, wherein the first interface is within or formed by the sub-channel region, and wherein semiconductor substrate comprises a vertically varying dopant concentration of deep energy acceptor dopant atoms that is locally increased at the first interface.

Separately or in combination, the vertically varying dopant concentration is such that the semiconductor substrate has a first dopant concentration of the deep energy acceptor dopant atoms at the first interface, has at most a second dopant concentration of deep energy acceptor dopant atoms at a first position that is within the first region and at most a second dopant concentration of deep energy acceptor dopant atoms at a second position that is within the second region, and wherein the second dopant concentration is below the first dopant concentration.

Separately or in combination, a magnitude of the first dopant concentration is sufficient to substantially eliminate a two-dimensional charge carrier gas at the first interface.

Separately or in combination, the first dopant concentration is at least $10^{19}$ dopant atoms/cm$^3$, and wherein the second dopant concentration is no greater than $10^{18}$ dopant atoms/cm$^3$.

Separately or in combination, the first region of type III-V material is a region of GaN or AlGaN, and wherein the second region of type III-V material is a region of AlGaN or AlN with a higher aluminum content than the first region of type III-V material.

Separately or in combination, the sub-channel region comprises a graded region of type III-V semiconductor material and a second region of type III-V material below the graded region, the graded region of type III-V semiconductor material comprises a compound III-V semiconductor material with a vertically varying composition, the semiconductor substrate comprises a second interface between the graded region and the second region, and the first interface is on the graded region opposite the second interface, and the vertically varying dopant concentration is such that the concentration of deep energy acceptor dopant atoms is locally increased at the first interface and at the second interface.

Separately or in combination, the semiconductor substrate comprises a back-barrier region below the channel layer, the back-barrier region is a region of AlGaN, the second region is a region of AlGaN, and the graded region is a region of AlGaN with an aluminum concentration matching that of the back-barrier region at the first interface and matching that of the second region at the second interface.

Separately or in combination, a composition of type III material of the graded region changes linearly moving from the first interface to the second interface, and the vertically varying dopant concentration is such that the semiconductor substrate has a first dopant concentration throughout the graded region.

Separately or in combination, a composition of type III material of the graded region changes stepwise moving from the first interface to the second interface, and wherein the vertically varying dopant concentration is such that the semiconductor substrate has at least a first dopant concentration of the deep energy acceptor atoms at each stepwise transition between regions of different composition and has at most a second concentration of the deep energy acceptor dopant atoms lower than the first concentration between each of the stepwise transitions, wherein the second concentration is below the first concentration.

Separately or in combination, the sub-channel region comprises a fixed composition region and a superlattice region disposed below the fixed composition region, the fixed region of type III-V semiconductor material comprises a constant composition of type III material throughout a thickness of the fixed composition region, the superlattice region comprises layers of type III-V semiconductor material with alternating composition of type III material, and the first interface is between the fixed composition region and the superlattice region.

Separately or in combination, the vertically varying dopant concentration is such that semiconductor substrate has a first concentration of the deep energy acceptor dopant atoms at the first interface, has a second dopant concentration of the deep energy acceptor dopant atoms at a location that is within the fixed composition region, and has a third dopant concentration of the deep energy acceptor dopant atoms at a location that is within the superlattice region, wherein the third dopant concentration is below the first dopant concentration and above the second dopant concentration.

Separately or in combination, the first region is the channel layer or a back-barrier region that is disposed below the channel layer, and wherein the second region is an upper region of the sub-channel region.

A high-electron mobility transistor is disclosed. According to an embodiment, the high-electron mobility transistor comprises a semiconductor substrate comprising a barrier region, a channel layer that is disposed below the barrier region, the channel layer forming a heterojunction with the barrier region such that a two-dimensional charge carrier gas channel is disposed in the channel layer near the heterojunction, source and drain electrodes disposed on the semiconductor substrate and each being in ohmic contact with the two-dimensional charge carrier gas channel, a gate electrode disposed on the semiconductor substrate and configured to control a conductive connection between the source and drain electrodes by controlling a conductive state of the two-dimensional charge carrier gas channel, and a first interface in the semiconductor substrate below the two-dimensional charge carrier gas channel between first and second regions of type III-V material which form polarization charges on either side of the first interface, and wherein the semiconductor substrate comprises a vertically varying dopant concentration of deep energy acceptor dopant atoms that is configured to compensate for negative polarization charges at the first interface.

Separately or in combination, the vertically varying dopant concentration is such that the semiconductor substrate has a locally increased concentration of the deep energy acceptor atoms at the first interface.

Separately or in combination, the vertically varying dopant concentration is such that the semiconductor substrate has a decreased concentration of the deep energy acceptor atoms above and below the first interface.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes FIGS. 2A, 2B and 2C, illustrates energy band diagrams at an interface between region of GaN and a region of AlGaN.

DETAILED DESCRIPTION

Embodiments of a high-electron mobility transistor with advantageous off-state leakage properties are disclosed herein. The high-electron mobility transistor comprises a semiconductor substrate with a barrier region and channel layer. The barrier region and channel layers form a heterojunction with one another such that a two-dimensional charge carrier gas channel (e.g., a 2DEG) is disposed near the heterojunction. This two-dimensional charge carrier gas provides the active device channel of the high-electron mobility. In a sub-channel region of the semiconductor substrate that is beneath the two-dimensional charge carrier gas channel, the semiconductor substrate comprises multiple regions of type III-V material. These regions can have a variety of different purposes, such as nucleation layers, lattice transition regions, and back-barrier regions, etc. These regions create interfaces of type III-V material with a difference in bandgap, and in particular between a first region of type III-V material and a second subjacent region of type III-V material with a larger bandgap. These interfaces create potential minority carrier channels (e.g., 2DHG) that represent conduction paths for minority carriers to flow in an off-state of the high-electron mobility transistor. The semiconductor substrate has a vertically varying dopant concentration of deep energy acceptor dopant atoms (e.g., carbon atoms) that is locally increased at at least one of these interfaces. The deep energy acceptor dopant atoms compensate for negative polarization charges at these interfaces, thereby suppressing or eliminating the minority carrier channels. As a result, lateral leakage along these interfaces is suppressed or eliminated.

Figure 1:
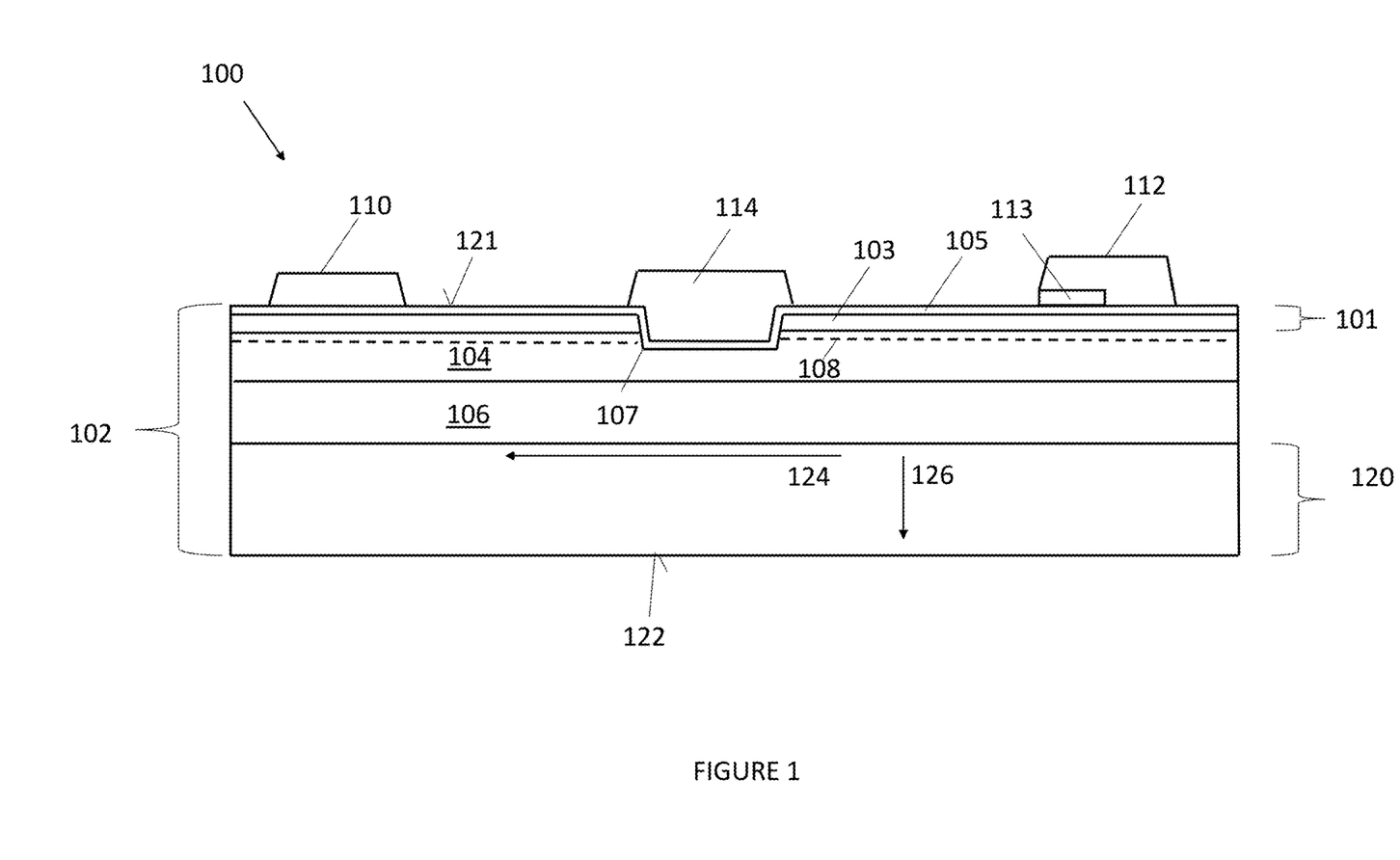
FIG. 1 illustrates a high-electron mobility transistor, according to an embodiment.

Referring to FIG. 1, a high-electron mobility transistor 100 comprises a semiconductor substrate 102. The semiconductor substrate 102 comprises a barrier region 101 and a channel layer 104 disposed below the barrier region 101. The barrier region 101 comprises type III-V semiconductor material and the channel layer 104 comprises type III-V semiconductor material with a different bandgap as the type III-V semiconductor material of the barrier region 101. For instance, the channel layer 104 can comprise GaN or AlGaN and the barrier region 101 can comprise AlGaN with a higher aluminum content as the channel layer 104. The channel layer 104 forms a heterojunction with the barrier region 101 such that a two-dimensional charge carrier gas channel 108 (e.g., a 2DEG) is disposed in the channel layer 104 near the heterojunction. As shown, the barrier region 101 may comprise a first barrier layer 103 and a second barrier layer 105. The first barrier layer 103 corresponds to a portion of the barrier region 101 that is formed before the gate trench 107 is formed (e.g., by etching) in the semiconductor substrate 102. The second barrier layer 105 corresponds to a portion of the barrier region 101 that is formed after the gate trench 107 is formed, i.e., a so-called regrown barrier layer 105. The first and second barrier layers 103, 105 may comprise type III-V semiconductor material of at least substantially identical impurity concentration to one another, e.g., layers of AlGaN with substantially similar aluminum content.

The high-electron mobility transistor 100 may additionally include electrically insulating layers (not shown) on the main surface 121 of the semiconductor substrate 102. These electrically insulating layers can comprise an electrically insulating material, e.g., silicon nitride, silicon dioxide, etc., and may be configured as passivation layers, for example.

The high-electron mobility transistor 100 further comprises source, drain and gate electrodes 110, 112, 114. Each of the source, drain and gate electrodes 110, 112, 114 may comprise a conductive metal, such as tungsten or aluminum, or highly doped monocrystalline or polycrystalline semiconductors. The source and drain electrodes 110, 112 are each in ohmic contact with the two-dimensional charge carrier gas channel 108. As shown, the high-electron mobility transistor 100 may comprise a region 113 of doped type III-V semiconductor material (e.g., p-type GaN) as part of the drain electrode 112. This arrangement forms a hybrid drain structure that mitigates dynamic $R_{DSON}$ (drain-source on-resistance) effects. As shown, the gate electrode 114 may be provided in a gate trench 107 in the semiconductor substrate 102 to enable better control of the two-dimensional charge carrier gas channel 108. This structure represents just one example of a wide variety of potential configurations for the source, drain and gate electrodes 110, 112, 114, and a variety of different configurations are possible to achieve the device operation described below. A non-exhaustive list of these device types include devices with Schottky diodes incorporated into the gate structure, MIS (metal-insulator-semiconductor) gate structures, and gate structure with a region of doped III-V semiconductor nitride material such as p-GaN.

The working principle of the high-electron mobility transistor 100 is as follows. The two-dimensional charge carrier gas channel 108 is the active channel of the device. In an on-state of the device, the source and drain electrodes 110, 112 are electrically connected to one another via the two-dimensional charge carrier gas channel 108. In the off-state of the device, the two-dimensional charge carrier gas channel 108 is locally disrupted so that the source and drain electrodes 110, 112 are not connected to one another. The device is transitioned between the on-state and the off-state by the application of a gate potential to the gate electrode 114. This influences an electric field beneath the gate, which in turn determines whether the two-dimensional charge carrier gas channel 108 is locally disrupted.

The high-electron mobility transistor 100 can be a so-called normally-off device, wherein the gate structure is configured to disrupt the (naturally occurring) two-dimensional charge carrier gas channel 108 at zero gate bias. For example, the high-electron mobility transistor 100 may comprise material such as p-type GaN as part of the gate electrode 114 that generates an electric field that disrupts the two-dimensional charge carrier gas channel 108 at zero gate bias. Alternatively, the high-electron mobility transistor 100 can be a so-called normally-on device wherein the two-dimensional charge carrier gas channel 108 is only disrupted when a bias (e.g., a negative bias) is applied to the gate electrode.

The semiconductor substrate 102 additionally comprises a sub-channel region 120 beneath the two-dimensional charge carrier gas channel 108. The sub-channel region 120 encompasses all regions of the semiconductor substrate 102 that are between the channel layer 104 and a rear surface 122 of the semiconductor substrate 102 that is opposite from a main surface 121 of the semiconductor substrate 102. Generally speaking, the regions of the sub-channel region 120 can include regions of type IV semiconductor material (e.g., Silicon, Silicon Carbide), regions of type III-V semiconductor material (e.g., GaN and AlGaN) and other regions of type III-V material (e.g., AlN). For example, the sub-channel region 120 may comprise a base substrate of silicon that extends to the rear surface 122 of the semiconductor substrate 102, a thin (e.g., 100-200 nm thick) nucleation layer of AlN that is disposed on the base substrate and is used to epitaxially grow type III-V semiconductor material thereon, and a lattice transition region disposed on the nucleation layer. The lattice transition region may comprise multiple layers of type III-V nitride material with varying crystalline properties e.g., layers of GaN/AlGaN/AlN. This alleviates mechanical stresses in the semiconductor substrate 102 resulting from lattice mismatch with the crystalline material of the base substrate, thereby enabling growth of high crystalline quality type III-V semiconductor material thereon. Additionally, or alternatively, semiconductor substrate may comprise a back-barrier region 106 disposed on the lattice transition region and/or directly underneath the channel region 104. The back-barrier region can be a compound region of type III-V semiconductor material, e.g., a region of AlGaN with a constant aluminum concentration, which may be provided to increase carrier confinement in the two-dimensional charge carrier gas channel 108.

The high-electron mobility transistor 100 is susceptible to leakage currents, i.e., unwanted flow of carriers, during an off-state of the device. Minority carriers (e.g., holes) can be generated underneath the drain electrode 112 by impact ionization in the presence of a large drain-substrate bias and/or by injection, e.g., in the case of a region 113 of doped type III-V semiconductor material such as p-type GaN as part of the drain electrode 112. These minority carries can contribute to minority carrier flow in the sub-channel region 120 that is the dominant source of off-state leakage current. Specifically, these leakage currents include a lateral off-state leakage current 124 and a vertical off-state leakage current 126. The lateral off-state leakage current 124 flows in a lateral direction of the device, i.e., parallel to the main surface 121 of the semiconductor substrate 102. The lateral off-state leakage current 124 results from the fact that minority carrier channels are provided along interfaces of material with a difference in bandgap, a concept that will be described in further detail below. The vertical off-state leakage current 126 flows in a vertical direction of the device, i.e., perpendicular to the main surface 121 of the semiconductor substrate 102. The vertical off-state leakage current 126 results from the fact that a potential difference exists between drain terminal and the semiconductor substrate 102, and that some minority carriers can traverse across energy barriers between various energy interfaces of the sub-channel region 120, e.g., through thermally-driven processes or Fowler-Nordheim tunneling.

Figures 2A, 2B:
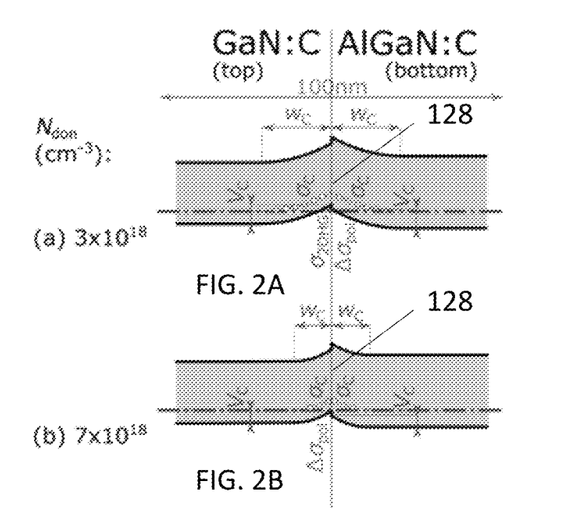
FIG. 2A illustrates the energy band diagrams at a first level of carbon doping.
FIG. 2B illustrates the energy band diagrams at a second level of carbon doping that is higher than the first level.
Figure 2C:
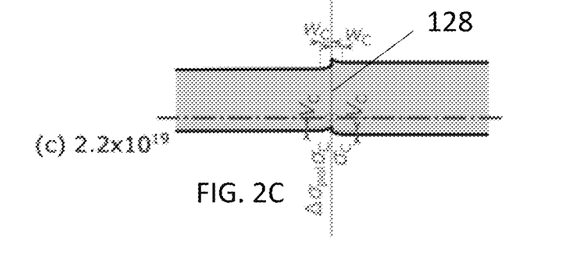
FIG. 2C illustrates the energy band diagrams at a third level of carbon doping that is higher than the second level.

Referring to FIG. 2, several energy band diagrams are shown at an interface 128 between a region of GaN and a region of AlGaN. Due to the polarization effects between the region of GaN and the region of AlGaN, a band bending occurs at the interface. FIGS. 2A-2C illustrate the impact of carbon concentration at the interface 128. FIG. 2A depicts the energy band diagrams at a carbon concentration of $3 \times 10^{18}$ dopant atoms/cm$^3$, FIG. 2B depicts the energy band diagrams at a carbon concentration of carbon concentration of $7 \times 10^{18}$ dopant atoms/cm$^3$, and FIG. 2C depicts the energy band diagrams at a carbon concentration carbon of $2.2 \times 10^{19}$ dopant atoms/cm$^3$. In each case, the stated carbon concentration is present in the region of GaN and the region of AlGaN, i.e., on either side of the interface 128.

As can be appreciated from a comparison of FIGS. 2A, 2B and 2C, an increased carbon concentration at the interface 128 has the effect of reducing the energy band bending at the interface 128. This is due to compensation of polarization charges at the interface 128. These polarization charges include negative sheet charges in the form of a 2DEG that are compensated by positive charges (holes). These positive charges can be free holes in a 2DHG or unoccupied acceptors from the carbon oping, which are also positively charged. The higher the carbon concentration, the higher the positive charge density and therefore less 2DHG concentration needed for compensation. If the carbon concentration is high enough, no 2DHG forms at all.

By proving a concentration of carbon atoms at the interface 128, charge traps are created that reduce the amount of negative polarization charges at the interface 128. This in turn reduces the amount of free holes attracted to the interface 128 and hence mitigates or substantially eliminates the 2DHG channel. In FIG. 2A, the amount of deep acceptor atoms near the interface are insufficient to fully compensate all negative polarization charges, and hence a two-dimensional hole gas (2DHG) remains near the interface 128. FIGS. 2B and 2C show that with sufficient deep energy acceptor dopant concentration, the negative polarization charges can be fully compensated, which in turn eliminates the 2DHG. In FIG. 2C, the 2DHG is not only prohibited but also the energy barrier to generate thermal holes at this position is very high. Thus, conduction of holes is dramatically reduced.

It should be appreciated that the specific parameters discussed with reference to FIGS. 2A, 2B and 2C including material type and carbon concentration are exemplary values used to illustrate a channel suppression concept. The specific values disclosed can be adapted to different material combinations with different parameters. For instance, the polarization effects are dependent upon the aluminum content difference in the GaN material. Thus, a greater amount of carbon concentration is needed to compensate for a GaN/AlGaN interface with a greater difference in aluminum content. Instead of aluminum and GaN, other type III-V material combinations, e.g., InGaN, InGaAs, AlGaAs, etc. may be used to similar effect.

Figure 3:
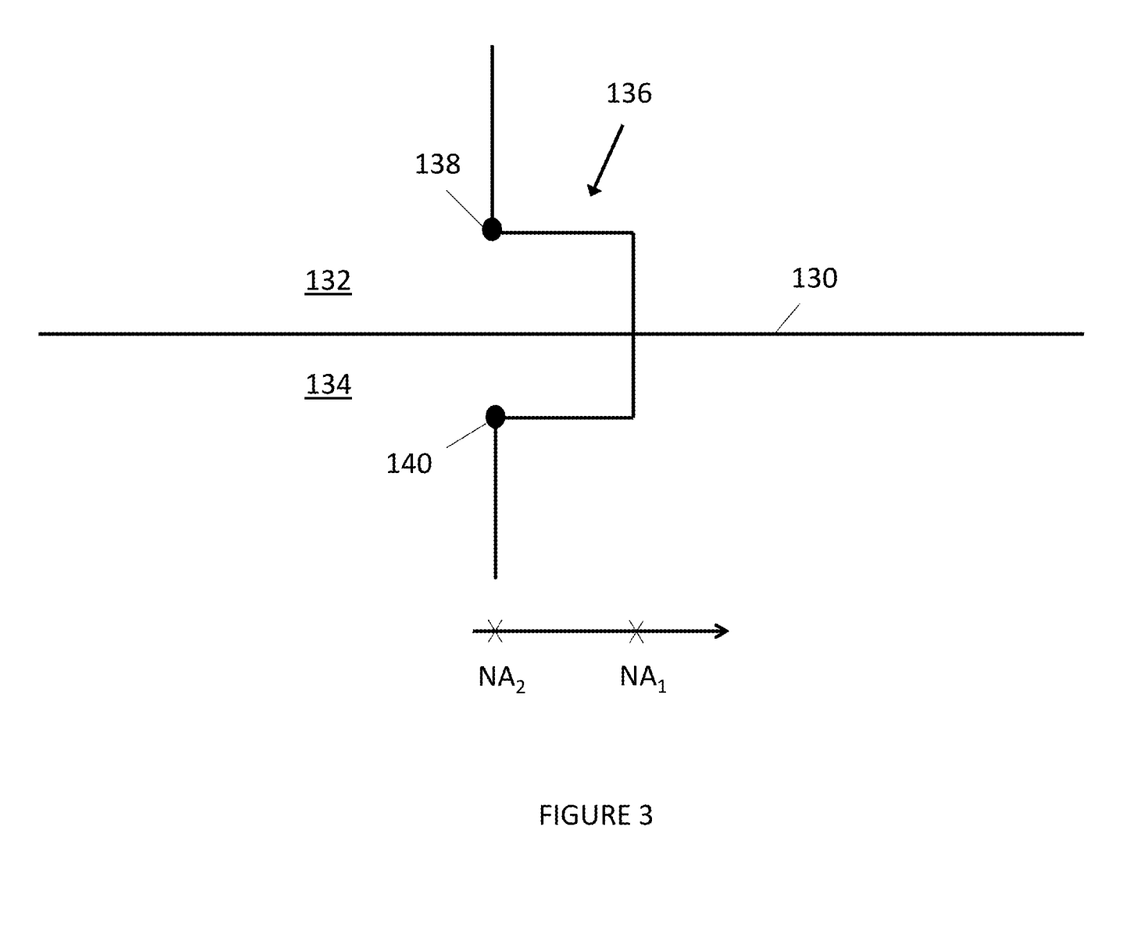
FIG. 3 illustrates a vertically varying dopant concentration of deep energy acceptor dopant atoms at an interface between two regions of type III-V material, according to an embodiment.

Referring to FIG. 3, a first interface 130 of the high-electron mobility transistor 100 is depicted. The first interface 130 is between a first region 132 of type III-V material and a second region 134 of type III-V material that is disposed below the first region 132 and has a different bandgap as the first region 132. Moreover, a polarization effect occurs at the first interface 130 which leads to the band bending effect as described above. The first interface 130 is within or formed by the sub-channel region 120 of the semiconductor substrate 102. That is, either one or both of the first and second regions 132, 134 are part of the sub-channel region 120. Generally speaking, the first and second regions 132, 134 can be any two regions of type III-V material in the semiconductor substrate 102 that are below the two-dimensional charge carrier gas channel 108 and band bending due to polarization effects. As detailed above, the sub-channel region 120 of the substrate 102 may comprise multiple different layers or regions of type III-V material with different composition, e.g., aluminum content. This can create multiple interfaces for minority carriers that conduct the lateral off-state leakage current 124 described above. Thus, the first interface 130 may be an interface between a first region 132 that is GaN and a second region 134 that is AlGaN, an interface between a first region 132 that is AlGaN and a second region 134 that is AlGaN with a higher aluminum content as the first region 132, an interface between a first region 132 that is AlGaN and a second region 134 that is AlN, etc. Of particular concern are those interfaces that are closest to the two-dimensional charge carrier gas channel 108 and/or have a polarization charges, as they represent the greatest possible source of lateral off-state leakage conduction.

The semiconductor substrate 102 comprises a vertically varying dopant concentration 136 of deep energy acceptor dopant atoms. That is, the semiconductor substrate 102 has been doped with deep energy acceptor dopant atoms such that the concentration of the deep energy acceptor dopant atoms varies in a vertical direction that is perpendicular to the main surface 121. The vertically varying dopant concentration 136 is schematically imposed over the figure, with the magnitude of the dopant concentration increasing from left to right. The deep energy acceptor dopant atoms are dopant atoms that form charge traps in the underlying material. For instance, in the case of a GaN based semiconductor substrate 102, the dopant concentration 136 may be a carbon doping of the semiconductor substrate 102. The vertically varying dopant concentration 136 is locally increased at the first interface 130, meaning that the magnitude of the dopant concentration 136 is greater at the first interface 130 than at locations on one or both sides of the first interface 130.

In the depicted embodiment, the vertically varying dopant concentration 136 is such that the semiconductor substrate 102 has a first concentration $NA_1$ of the deep energy acceptor dopant atoms at the first interface 130 and has a second concentration $NA_2$ of the deep energy acceptor dopant atoms lower than the first concentration $NA_1$ at first and second locations 138, 140 that are respectively disposed within the first region 132 and the second region 134.

By providing the vertically varying dopant concentration 136 to be locally increased at the first interface 130, a beneficial improvement in the lateral off-state leakage current 124 can be obtained. Specifically, the magnitude of the higher dopant concentration (i.e., the first concentration $NA_1$) at the first interface 130 can be selected to create sufficient charge traps to compensate for negative polarization charges, thereby suppressing or eliminating a hole channel at the first interface 130. As a result, the lateral off-state leakage current 124 at the first interface 130 can be reduced or eliminated. In an embodiment, the first concentration $NA_1$ can be at least $10^{18}$ dopant atoms/cm$^3$, e.g., in the range of $10^{18}$ dopant atoms/cm$^3$ to $10^{20}$ dopant atoms/cm$^3$. As can be appreciated from the discussion with reference to FIG. 2, at certain material parameters, this has the effect bending the energy bands at the first interface 130 to substantially mitigate hole currents.

Meanwhile, by lowering the concentration of the of the deep energy acceptor dopant atoms in the substrate 102 to have at most the second concentration $NA_2$ at locations that are immediately outside of the first interface 130, a beneficial improvement in the vertical off-state leakage current 126 can be obtained. This results from a reduction in trap-assisted conduction mechanisms in the sub-channel region 120 of the substrate 102. In an embodiment, the second concentration $NA_2$ is in the range of $10^{16}$ dopant atoms/cm$^3$-$10^{17}$ dopant atoms/cm$^3$. These values are associated with background values of unintentionally doped material. In another embodiment, the vertically varying dopant concentration 136 may be such that the substrate 102 has at most the second concentration $NA_2$ of deep energy acceptor dopant atoms at one of the first and second locations 138, 140, and has a third deep energy acceptor concentration that is lower than the second concentration $NA_2$ at the other one of the first and second locations 138, 140.

In absolute terms, the first concentration $NA_1$ can be at least $10^{19}$ dopant atoms/cm$^3$ and the second concentration $NA_2$ can be at least $10^{19}$ dopant atoms/cm$^3$. In relative terms, the first concentration $NA_1$ can be at least 3 times greater than the second concentration $NA_2$, preferably at least 5 times greater than the second concentration $NA_2$, at least 10 times greater than the second concentration $NA_2$, etc.

The vertically varying dopant concentration 136 illustrates one example of a dopant profile wherein the concentration of the deep energy acceptor dopant atoms is locally increased at the first interface 130. More generally, the vertically varying dopant concentration 136 can have any type of vertically varying profile wherein a higher concentration of the deep energy acceptor dopant atoms is provided at the first interface 130 so as to compensate for negative polarization charges at the first interface 130 and a lower concentration of the deep energy acceptor dopant atoms is provided above and/or below the first interface 130.

For example, the vertically varying dopant concentration 136 can be such that the concentration of deep energy acceptor dopant atoms gradually changes from the second concentration $NA_2$ to the first concentration $NA_1$ at the first location 138 and/or the second location 140 instead of the abrupt transitions as shown. Additionally, or alternatively, the vertically varying dopant concentration 136 can be curved or undulating in the vertical direction of the semiconductor substrate 102. Additionally, or alternatively, the vertically varying dopant concentration 136 can be such that the lower dopant concentration values (i.e., the second concentration $NA_2$ in the depicted example) are not necessarily the same on either side of the first interface 130.

Figure 4:
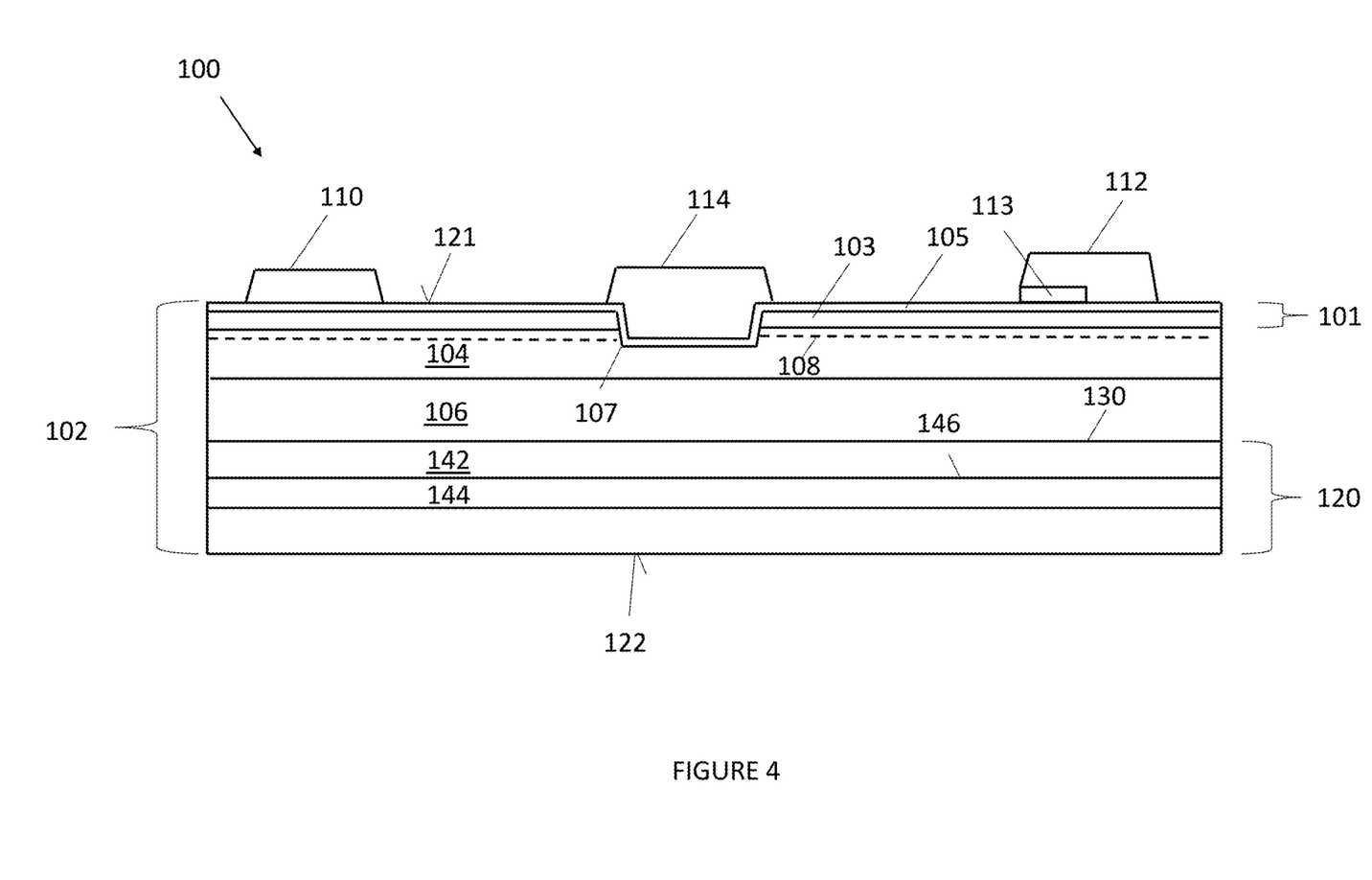
FIG. 4 illustrates a high-electron mobility transistor, according to an embodiment.

Referring to FIG. 4, a high-electron mobility transistor 100 is depicted, according to an embodiment. In this embodiment, the sub-channel region 120 of the high-electron mobility transistor 100 comprises a graded region 142 of type III-V semiconductor material and a second region 144 of type III-V material below the graded region. In this example, an interface between the back-barrier region 106 and the graded region 142 is referred to as the first interface 130 of the semiconductor substrate 102. The semiconductor substrate 102 further comprises a second interface 146 between the graded region 142 and the second region 144. The graded region 142 of type III-V semiconductor material has a varying composition of type III material (e.g., Al content, In content, etc.) moving from the first interface 130 to the second interface 146. In one embodiment, the composition of type III material of the graded region changes linearly moving from the first interface to the second interface. In another embodiment, the composition of type III material of the graded region changes stepwise moving from the first interface to the second interface. Specific examples of these varying composition profiles are illustrated in FIGS. 5 and 6, wherein the type III material that is varied is the aluminum content.

Figure 5:
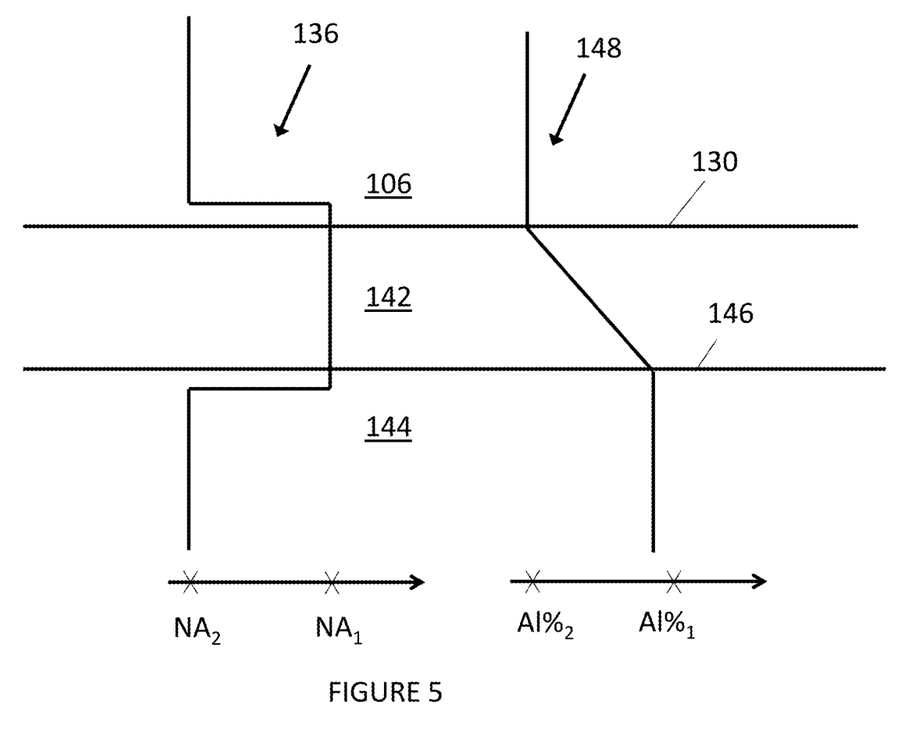
FIG. 5 illustrates a deep energy acceptor dopant concentration and an aluminum content at first and second interfaces of the semiconductor substrate of the high-electron mobility transistor of FIG. 4, according to an embodiment.
Figure 6:
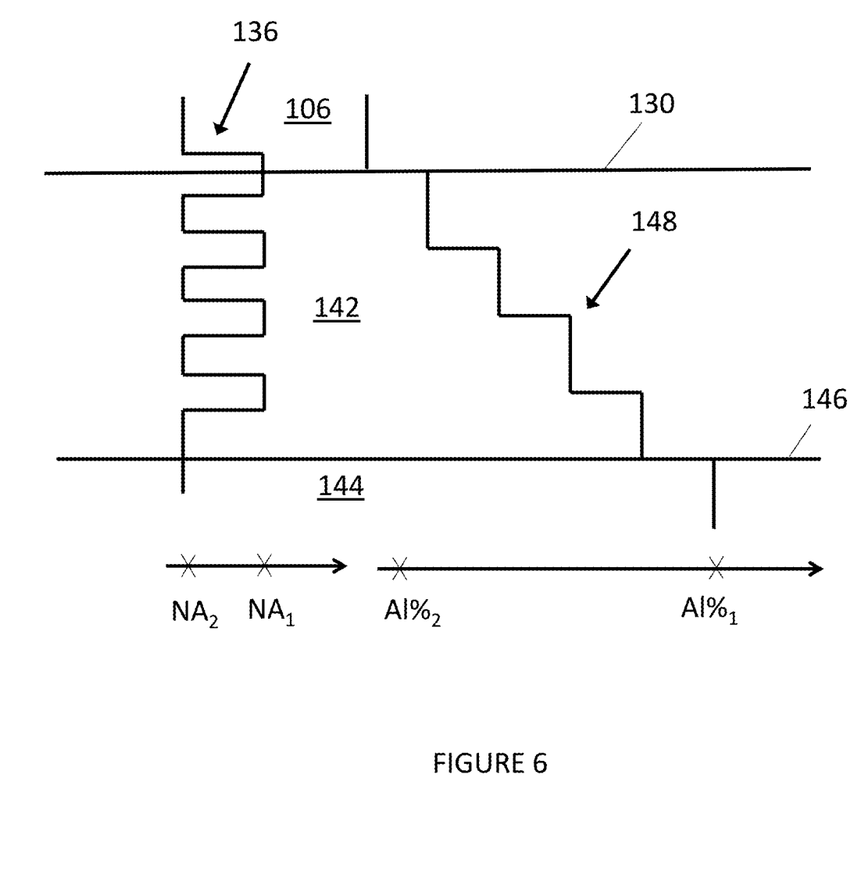
FIG. 6 illustrates a deep energy acceptor dopant concentration and an aluminum content at first and second interfaces of the semiconductor substrate of the high-electron mobility transistor of FIG. 4, according to another embodiment.

Referring to FIG. 5, an exemplary profile of material parameters across the first and second interfaces 130, 146 of the high-electron mobility transistor 100 described with reference to FIG. 4 is shown. These parameters include the dopant concentration 136 of deep energy state dopant atoms in the substrate 102 and an aluminum content 148 of the substrate 102. In the figure, the magnitude of the dopant concentration 136 increases moving from left to right, i.e., in a similar manner as FIG. 3. Likewise, the magnitude of the aluminum content 148 increases moving left from right.

In this example, the second region 144 is a region of AlGaN with a first aluminum concentration Al %$_1$ (e.g., 50%), the back-barrier region 106 is a region of GaN with a second aluminum concentration Al %$_2$ that is lower than the first aluminum concentration Al %$_1$ (e.g., 3%). The graded region 142 is a region of AlGaN with an aluminum content 148 that changes linearly moving from the first interface 130 to the second interface 146. That is, the aluminum content 148 has a constant rate of change moving in the vertical direction of the semiconductor substrate 102. This profile can be realized by an epitaxially deposited region of AlGaN wherein the aluminum content is varied in a time-varying manner during deposition. In the depicted embodiment, the aluminum content 148 in the graded region 142 substantially matches that of the back-barrier region 106 (i.e., the second aluminum concentration Al %$_2$) at the first interface 130 and substantially matches that of the second region 144 (i.e., the first aluminum concentration Al %$_1$) at the second interface 146.

In this example, the vertically varying dopant concentration 136 is such that the semiconductor substrate 102 has a locally increased concentration of the deep energy state dopant atoms at both the first interface 130 and the second interface 146. As shown, this can be provided by a vertically varying dopant concentration 136 similar to that described with respect to FIG. 3 wherein the portion of the semiconductor substrate 102 having the first concentration $NA_1$ vertically overlaps with both of the first and second interfaces 130, 146. By providing an amount of deep energy state dopant atoms at the first and second interfaces 130, 146 sufficient to compensate negative polarization charges (e.g., the first concentration $NA_1$), the vertically varying dopant concentration 136 ensures that the first interface 130 and the second interface 146 are not leakage paths for the lateral off-state leakage current 124. Moreover, by making the aluminum content 148 linearly varying, the polarization charge is distributed over a larger area so that the area of positive compensation is increased. In that way, a significantly smaller carbon concentration is needed to compensate all negative polarization charges and hence prevents the formation of a 2DHG. More generally, the vertically varying dopant concentration 136 can have any of the above-described profiles to obtain a locally increased concentration of deep energy state dopant atoms in the vicinity of the first and second interfaces 130, 146.

The vertically varying dopant concentration 136 is such that the semiconductor substrate 102 has a decreased concentration of the deep energy state dopant atoms at locations above and below the first interface 130 and the second interface 146. As shown, the first interface corresponds to an interface between the graded region 142 and the back-barrier region 106. More generally, the first interface 130 can be any interface between the graded region 142 and the superjacent region, i.e., an interface opposite the second interface 146. For instance, in a device wherein the back-barrier region 106 is omitted, the first interface 130 can be between the graded region 142 and the channel region 104.

Referring to FIG. 6, an exemplary profile of material parameters across the first and second interfaces 130, 146 of the high-electron mobility transistor 100 described with reference to FIG. 4 is shown, according to another embodiment.

In this example, the second region 144 is a region of AlGaN with a first aluminum concentration Al %$_1$ (e.g., 50%), the back barrier region is a region of AlGaN with a second aluminum concentration Al %$_2$ that is lower than the first aluminum concentration Al %$_1$ (e.g., 3%). The aluminum content 148 of the substrate 102 increases stepwise moving from the first interface 130 to the second first interface 130. This profile can be realized by a plurality of epitaxially deposited layers of, e.g., AlGaN, with a defined thickness and aluminum content in each layer.

In the embodiment of FIG. 6, the vertically varying dopant concentration 136 is such that the semiconductor substrate 102 has a locally increased concentration of deep energy acceptor dopant atoms at each stepwise transition between regions of different aluminum content. As shown, this can be obtained by replicating the vertically varying dopant concentration 136 described with respect to FIG. 3 at each stepwise transition the aluminum content 148. As a result, the semiconductor substrate 102 has the first concentration NA$_1$ of deep energy acceptor dopant atoms at each stepwise transition and has a decreased concentration of deep energy acceptor dopant atoms (the second concentration NA$_2$) in vertical regions between each stepwise transition. This ensures that the interfaces with the potential for polarization effects are not leakage paths for the lateral off-state leakage current 124. Meanwhile, the vertical off-state leakage current 126 is maintained low by providing the decreased concentration of deep energy acceptor dopant atoms in between each stepwise transition. More generally, the same effect may be obtained by if the vertically varying dopant concentration 136 is such that the semiconductor substrate 102 has at most the first concentration NA$_1$, at each stepwise transition, meaning that the various peaks may differ from one another at values higher than the first concentration NA$_1$, and such that the semiconductor substrate 102 has at most the second concentration NA$_2$ between each of the stepwise transitions, meaning that the various nadirs may differ from one another at values lower than the second concentration NA$_2$.

Figure 7:
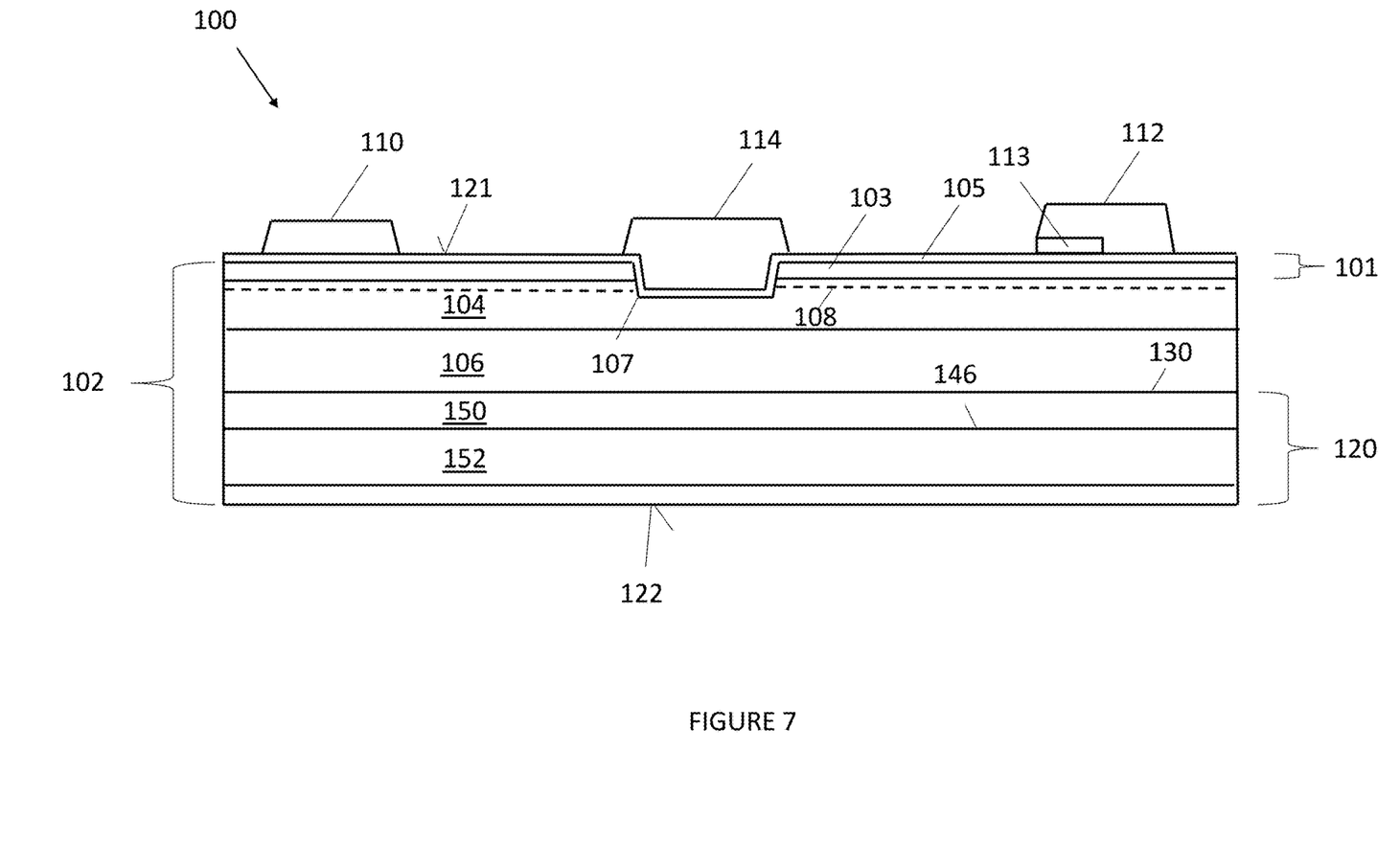
FIG. 7 illustrates a high-electron mobility transistor, according to an embodiment.

Referring to FIG. 7, a high-electron mobility transistor 100 is depicted, according to another embodiment. In this embodiment, the sub-channel region 120 of the high-electron mobility transistor 100 comprises a fixed composition region 150 of type III-V semiconductor material and a superlattice region 152 disposed below the fixed composition region 150. In this example, the interface between the fixed composition region 150 and the superlattice region 152 is referred to as the first interface 130. The fixed composition region 150 of type III-V semiconductor material comprises a constant composition of type III material (e.g., Al content, In content, etc.) throughout a thickness of the fixed composition region 150. For example, the fixed composition region 150 can be a region of GaN or AlGaN, wherein the impurity content does not change throughout a thickness of the fixed composition region 150. The superlattice region comprises layers of type III-V semiconductor material with alternating composition of type III material (e.g., Al content, In content, etc.). A specific example of these composition profiles is illustrated in FIG. 8, wherein the varying type III material is the aluminum content.

Figure 8:
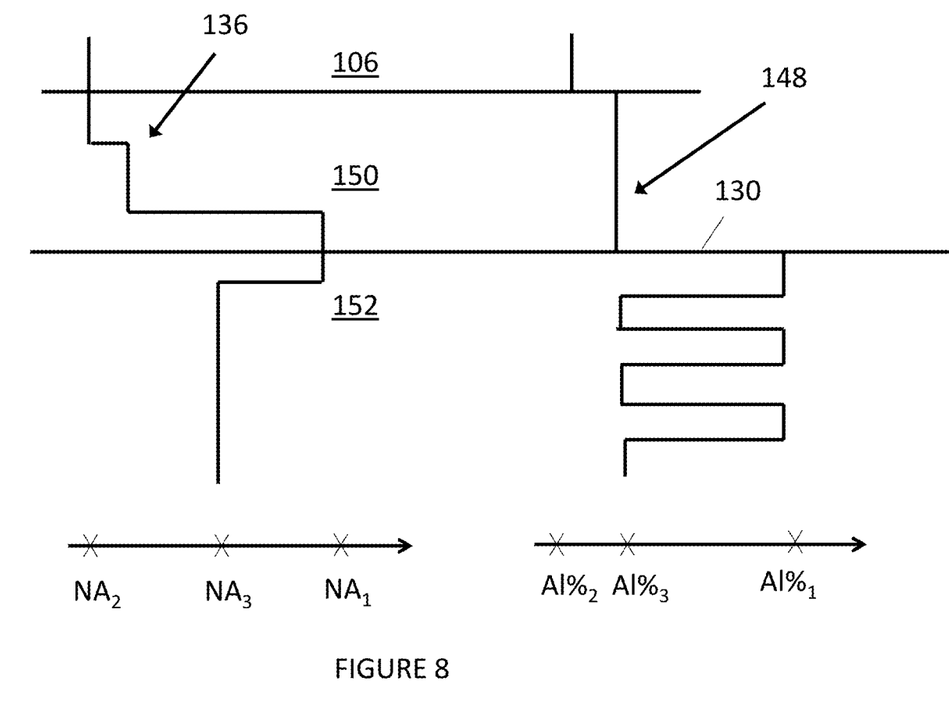
FIG. 8 illustrates a deep energy acceptor dopant concentration and an aluminum content at first and second interfaces of the semiconductor substrate of the high-electron mobility transistor of FIG. 7, according to another embodiment.

Referring to FIG. 8, an exemplary profile of material parameters across the first and second interfaces 130, 146 of the high-electron mobility transistor 100 described with reference to FIG. 7 is shown. These parameters include the dopant concentration 136 of deep energy state dopant atoms (e.g., carbon atoms) in the substrate 102 and an aluminum content 148 of the substrate 102. In the figure, the magnitude of the dopant concentration 136 increases moving from left to right, i.e., in a similar manner as FIG. 3. Likewise, the magnitude of the aluminum content 148 increases moving left from right.

In this example, the superlattice region 152 is a region comprising a plurality of layers of AlGaN, wherein the aluminum content of these layers alternates between a first aluminum concentration Al %$_1$ (e.g., 50%) and a third aluminum concentration Al %$_3$ (e.g., 5%). The back-barrier region 106 is a region of GaN with a second aluminum concentration Al %$_2$ that is lower than the third aluminum concentration Al %$_3$ (e.g., 3%). The fixed composition region 150 is a region of AlGaN with an aluminum concentration that is at or slightly below the third aluminum concentration Al %$_3$ (e.g., 3% or 5%).

In the embodiment of FIG. 8, the vertically varying dopant concentration 136 is such that the semiconductor substrate 102 has a locally increased concentration of deep energy acceptor dopant atoms at the first interface 130 that is between the fixed composition region 150 and the superlattice region 152. More particularly, the semiconductor substrate 102 has the first concentration NA$_1$ at the second interface 146. This ensures that the first interface 130 is not a leakage path for the lateral off-state leakage current 124. In this example, the first interface 130 is a primary interface for the lateral off-state leakage current 124 due to the large different in aluminum content. The interface between the back-barrier region 106 and the fixed composition region 150 does not represent a significant leakage interface because the difference in aluminum content between the channel region 104 and the fixed composition region 150 is relatively low (e.g., within 3% or less) such that the bandgap difference does not produce a significant carrier channel. Moreover, the vertically varying dopant concentration 136 is such that the semiconductor substrate 102 has a third concentration NA$_3$ of deep energy acceptor dopant atoms in a portion of the superlattice region 152 below the first interface 130. The third concentration NA$_3$ is below the first concentration NA$_1$ and above the second concentration NA$_2$. For instance, the third concentration NA$_3$ can be about $10^{18}$ dopant atoms/cm$^3$ with the first concentration NA$_1$ being $10^{19}$ dopant atoms/cm$^3$ or greater. This represents a favorable tradeoff between suppression of lateral off-state leakage current 124 at each interface within the superlattice region 152 and mitigation of the vertical off-state leakage current 126.

In the above discussion, GaN, AlGaN and AlN are disclosed as exemplary type III-V materials that may provide the various layers of the high-electron mobility transistor 100. This material combination represents just one example of potential type III-V materials that can be used to provide the device concept described herein. More generally, a high-electron mobility transistor 100 according to any of the embodiments described herein can comprise any combination of binary III-V materials such as Gallium nitride (GaN), gallium arsenide (GaAs), aluminium nitride (AlN), aluminium arsenide (AlAs), indium nitride (InN), indium arsenide (InAs), etc., and ternary or quarternary type III-V semiconductor materials such as aluminium gallium nitride (AlGaN), aluminium gallium arsenide (AlGaAs), indium gallium nitride (InGaN), indium aluminium gallium nitride (InAlGaN), etc.

As used herein, the phrase "type III-V material" refers to a compound material that includes at least one Group III element, such as aluminum (Al), gallium (Ga), indium (In), and boron (B) and at least one Group IV element, such as nitrogen (N), phosphorous (P), and arsenic (As), and including but not limited to any of its alloys, such as aluminum gallium nitride (AlxGa(1-x)N), indium gallium nitride (InyGa(1-y)N), aluminum indium gallium nitride (AlxInyGa(1-x-y)N), gallium arsenide phosphide nitride (GaAsaPbN(1-a-b)), and aluminum indium gallium arsenide phosphide nitride (AlxInyGa(1-x-y)AsaPbN(1-a-b)), for example. Aluminum gallium nitride and AlGaN refers to an alloy described by the formula AlxGa(1-x)N, where 0<x<1.

As used herein, the term "deep energy acceptor dopant" refers to a or point defect that may be caused by an impurity dopant atom in a semiconductor material that with an energy level larger than the ionization energy KT (e.g., approx. 30 meV at room temperature) above the valence band maximum. As a further example, the ionization energy level may be 100 meV or more.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-V based compound semiconductor transistor incorporating a junction between two materials with different band gaps (i.e., a heterojunction) as the channel.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
    a semiconductor substrate comprising a barrier region, a channel layer disposed below the barrier region and forming a heterojunction with the barrier region such that a two-dimensional charge carrier gas channel is disposed in the channel layer near the heterojunction, and a sub-channel region disposed below the channel layer; and
    a first interface in the semiconductor substrate between a first region of type III-V material and a second region of type III-V material that is disposed below the first region of type III-V material,
    wherein the first and second regions of type III-V material form polarization charges on either side of the first interface,
    wherein the first interface is within or formed by the sub-channel region, and
    wherein the semiconductor substrate comprises a vertically varying dopant concentration of deep energy acceptor dopant atoms that is locally increased at the first interface.

2. The semiconductor device of claim 1, wherein the vertically varying dopant concentration is such that the semiconductor substrate has a first dopant concentration of the deep energy acceptor dopant atoms at the first interface, has at most a second dopant concentration of deep energy acceptor dopant atoms at a first position that is within the first region and at most a second dopant concentration of deep energy acceptor dopant atoms at a second position that is within the second region, and wherein the second dopant concentration is below the first dopant concentration.

3. The semiconductor device of claim 2, wherein a magnitude of the first dopant concentration is sufficient to substantially eliminate a two-dimensional charge carrier gas at the first interface.

4. The semiconductor device of claim 3, wherein the first dopant concentration is at least $10^{18}$ dopant atoms/cm$^3$, and wherein the second dopant concentration is no greater than $10^{17}$ dopant atoms/cm$^3$.

5. The semiconductor device of claim 3, wherein the first region of type III-V material is a region of GaN or AlGaN, and wherein the second region of type III-V material is a region of AlGaN or AlN with a higher aluminum content than the first region of type III-V material.

6. The semiconductor device of claim 1, wherein the sub-channel region comprises a graded region of type III-V semiconductor material and a second region of type III-V material below the graded region, wherein the graded region of type III-V semiconductor material comprises a compound III-V semiconductor material with a vertically varying composition, wherein the semiconductor substrate comprises a second interface between the graded region and the second region, and wherein the first interface is on the graded region opposite the second interface, and wherein the vertically varying dopant concentration is such that the concentration of deep energy acceptor dopant atoms is locally increased at the first interface and at the second interface.

7. The semiconductor device of claim 6, wherein the semiconductor substrate comprises a back-barrier region below the channel layer, wherein the back-barrier region is a region of AlGaN, wherein the second region is a region of AlGaN, and wherein the graded region is a region of AlGaN with an aluminum concentration matching that of the back-barrier region at the first interface and matching that of the second region at the second interface.

8. The semiconductor device of claim 6, wherein a composition of type III material of the graded region changes linearly moving from the first interface to the second interface, and wherein the vertically varying dopant concentration is such that the semiconductor substrate has a first dopant concentration throughout the graded region.

9. The semiconductor device of claim 6, wherein a composition of type III material of the graded region changes stepwise moving from the first interface to the second interface, and wherein the vertically varying dopant concentration is such that the semiconductor substrate has at least a first concentration of the deep energy acceptor dopant atoms at each stepwise transition between regions of different composition and has at most a second concentration of the deep energy acceptor dopant atoms lower than the first concentration between each of the stepwise transitions, wherein the second concentration is below the first concentration.

10. The semiconductor device of claim 2, wherein the sub-channel region comprises a fixed composition region and a superlattice region disposed below the fixed composition region, wherein the fixed region of type III-V semiconductor material comprises a constant composition of type III material throughout a thickness of the fixed composition region, wherein the superlattice region comprises layers of type III-V semiconductor material with alternating composition of type III material, and wherein the first interface is between the fixed composition region and the superlattice region.

11. The semiconductor device of claim 10, wherein the vertically varying dopant concentration is such that the semiconductor substrate has a first concentration of the deep energy acceptor dopant atoms at the first interface, has a second dopant concentration of the deep energy acceptor dopant atoms at a location that is within the fixed composition region, and has a third dopant concentration of the deep energy acceptor dopant atoms at a location that is within the superlattice region, wherein the third dopant concentration is below the first dopant concentration and above the second dopant concentration.

12. The semiconductor device of claim 1, wherein the first region is the channel layer or a back-barrier region that is disposed below the channel layer, and wherein the second region is an upper region of the sub-channel region.

13. A high-electron mobility transistor, comprising:
a semiconductor substrate comprising a barrier region, a channel layer that is disposed below the barrier region, the channel layer forming a heterojunction with the barrier region such that a two-dimensional charge carrier gas channel is disposed in the channel layer near the heterojunction;
source and drain electrodes disposed on the semiconductor substrate and each being in ohmic contact with the two-dimensional charge carrier gas channel;
a gate electrode disposed on the semiconductor substrate and configured to control a conductive connection between the source and drain electrodes by controlling a conductive state of the two-dimensional charge carrier gas channel; and
a first interface in the semiconductor substrate below the two-dimensional charge carrier gas channel between first and second regions of type III-V material which form polarization charges on either side of the first interface, and
wherein the semiconductor substrate comprises a vertically varying dopant concentration of deep energy acceptor dopant atoms that is configured to compensate for negative polarization charges at the first interface.

14. The high-electron mobility transistor of claim 13, wherein the vertically varying dopant concentration is such that the semiconductor substrate has a locally increased concentration of the deep energy acceptor dopant atoms at the first interface.

15. The high-electron mobility transistor of claim 13, wherein the vertically varying dopant concentration is such that the semiconductor substrate has a decreased concentration of the deep energy acceptor dopant atoms above and below the first interface.

* * * * *